United States Patent
Okita et al.

(10) Patent No.: US 10,292,315 B2
(45) Date of Patent: May 14, 2019

(54) COOLING DEVICE FOR ELECTRONIC DEVICE

(71) Applicants: IHI Corporation, Koto-ku (JP); National University Corporation Tokyo University of Agriculture and Technology, Fuchu-shi (JP)

(72) Inventors: Yoji Okita, Tokyo (JP); Akira Murata, Tokyo (JP)

(73) Assignees: IHI CORPORATION, Koto-ku (JP); NATIONAL UNIVERSITY CORPORATION TOKYO UNIVERSITY OF AGRICULTURE AND TECHNOLOGY, Fuchu-shi (JP)

( * ) Notice: Subject to any disclaimer, the term of this patent is extended or adjusted under 35 U.S.C. 154(b) by 0 days.

(21) Appl. No.: 15/813,293

(22) Filed: Nov. 15, 2017

(65) Prior Publication Data
US 2018/0077826 A1    Mar. 15, 2018

Related U.S. Application Data

(63) Continuation of application No. PCT/JP2016/068749, filed on Jun. 24, 2016.

(30) Foreign Application Priority Data

Oct. 15, 2015  (JP) ................................. 2015-203566

(51) Int. Cl.
*H05K 7/20*    (2006.01)
*B64C 25/36*   (2006.01)

(52) U.S. Cl.
CPC ......... *H05K 7/20909* (2013.01); *B64C 25/36* (2013.01); *H05K 7/2039* (2013.01);
(Continued)

(58) Field of Classification Search
CPC .............. H01L 23/467; H05K 7/20136; H05K 7/20145; H05K 7/20154; H05K 7/20172
(Continued)

(56) References Cited

U.S. PATENT DOCUMENTS 6,349,760 B1* 2/2002 Budelman ............. H01L 23/427
                                                165/104.33
8,037,926 B2* 10/2011 Martin et al. ......... H01L 23/427
                                                165/104.33
(Continued)

FOREIGN PATENT DOCUMENTS

JP    58-92796 U     6/1983
JP    61-181800      8/1986
(Continued)

OTHER PUBLICATIONS

International Search Report dated Sep. 6, 2016 in PCT/JP2016/068749, filed on Jun. 24, 2016 (with English Translation).
(Continued)

*Primary Examiner* — Allen J Flanigan
(74) *Attorney, Agent, or Firm* — Oblon, McClelland, Maier & Neustadt, L.L.P.

(57) ABSTRACT

A cooling device includes a heat sink that includes a plurality of first heat radiating fins and a plurality of second heat radiating fins, and a compressor as a blower that causes cooling air to flow from an inlet toward an outlet of a cooling passage of the heat sink. The cooling device includes in a flow direction of the cooling air that passes via the heat sink a mist supplier arranged upstream of the heat sink and that supplies mist M to the cooling passage of the heat sink.

4 Claims, 7 Drawing Sheets

(52) U.S. Cl.
CPC ..... *H05K 7/20918* (2013.01); *H05K 7/20936* (2013.01); *H05K 7/20172* (2013.01); *H05K 7/20345* (2013.01)

(58) Field of Classification Search
USPC .................................. 165/80.3, 121; 361/697
See application file for complete search history.

(56) References Cited

U.S. PATENT DOCUMENTS

| | | | |
|---|---|---|---|
| 8,760,017 B2 * | 6/2014 | Henke et al. .......... | H02K 11/33 310/62 |
| 2003/0205054 A1 | 11/2003 | Nori et al. | |
| 2004/0070939 A1 * | 4/2004 | Peng .................. | H05K 7/20163 361/697 |
| 2004/0250562 A1 * | 12/2004 | Adiga et al. .............. | F28D 5/00 62/259.2 |
| 2014/0326437 A1 * | 11/2014 | Kamitani et al. ......... | F24F 1/22 165/122 |

FOREIGN PATENT DOCUMENTS

| | | |
|---|---|---|
| JP | 64-61999 | 3/1989 |
| JP | 2005-14627 | 1/2005 |
| JP | 2006-49389 | 2/2006 |
| JP | 2012-164939 | 8/2012 |
| JP | 2013-74214 | 4/2013 |
| JP | 2013-164048 | 8/2013 |
| JP | 2015-98276 | 5/2015 |
| WO | WO 02/46677 A1 | 6/2002 |

OTHER PUBLICATIONS

Written Opinion dated Sep. 6, 2016 in PCT/JP2016/068749, filed on Jun. 24, 2016.

* cited by examiner

COOLING DEVICE FOR ELECTRONIC DEVICE

CROSS REFERENCE TO RELATED APPLICATIONS

This application is a continuation application of International Application No. PCT/JP2016/068749, filed on Jun. 24, 2016, which claims priority to Japanese Patent Application No. 2015-203566, filed on Oct. 15, 2015, the entire contents of which are incorporated by reference herein.

BACKGROUND

1. Technical Field

The present disclosure relates to a cooling device for electronic device used for cooling an electronic device such as a power electronics-based device.

2. Description of the Related Art

In recent times, a huge number of electronic devices are installed in a moving body such as an aircraft, a ship, a car, and the like. These electronic devices include power electronics-based devices that require high withstand voltage and high current. Moreover, because the electronic devices generate heat when operated, cooling devices are typically provided to cool these devices. The configuration of a conventional cooling device for electronic device (hereinafter referred to as "cooling device" for convenience of explanation) is explained below (see Japanese Patent Application Laid-Open Publication No. 2012-164939).

A conventional cooling device typically includes a heat sink (radiator) that is connected in a heat-conductive manner to an electronic device. The heat sink is constituted by a material having an excellent thermal conductivity, such as aluminum alloy, and includes a plurality of heat radiating fins capable of heat radiation (to radiate heat). The cooling device includes a blower, such as a fan, that causes cooling air to flow from an inlet toward an outlet of the heat sink.

In the conventional cooling device, the blower causes, while the electronic device is being operated, the cooling air to flow from the inlet of the heat sink toward the outlet of the heat sink. The heat generated by driving of the electronic device is transmitted to the heat sink and then radiated to the cooling air from the heat radiating fins. With such a configuration, the electronic device can be cooled and rise in the temperature of the electronic device can be suppressed.

Japanese Patent Application Laid-Open Publication No. 2005-14627 discloses a background art related to the present disclosure. The disclosed refrigerant circulating type cooling device is constituted by connecting a cooling plate, which cools a semiconductor element that is a high temperature heating element of the electronic device, a condenser installed outside an aircraft, and a refrigerant pump.

SUMMARY

The amount of heat generated by an electronic device tends to increase following an increase in the performance of the electronic device, and as a result, sufficiently increasing the radiation performance of a heat sink, in other words, the cooling performance of a cooling device is necessary. Therefore, usually, the heat transfer coefficient between the heat sink and the cooling air is increased by employing measures such as forming the heat radiating fins in a complex shape or increasing the number of the heat radiating fins. On the other hand, if such measures are employed on the heat sink, the pressure loss in the heat sink increases, resulting in upsizing of the blower and an increase in the energy consumption required for blowing the air.

In other words, there is a problem that sufficiently increasing the cooling performance of the cooling device while suppressing the upsizing of the blower and the increase in the energy consumption required for blowing the air is not easy.

In the view of above circumstances, an object of the present disclosure is to provide a cooling device for electronic device that can solve the above-mentioned problems.

According to one aspect of the present disclosure, a cooling device for an electronic device, includes a heat sink configured to be in thermal contact with the electronic device; and a mist supplier configured to supply mist to the heat sink, arranged upstream of the heat sink in a flow direction of cooling air passing via the heat sink.

According to the present disclosure, a cooling device for electronic device that can sufficiently increase the cooling performance while suppressing the upsizing of the blower and the increase in the energy consumption required for blowing the air can be provided.

DESCRIPTION OF THE EMBODIMENTS

Exemplary embodiments of the present disclosure are explained with reference to the accompanying drawings. The term "arrange/arranged" refers to a case in which a structural component is directly arranged and also refers to a case in which a structural component is indirectly arranged via another member. The term "include/included" refers to a case in which a structural member is directly included and also refers to a case in which a structural component is indirectly included via another member. The term "downstream" refers to downstream in a flow direction of cooling air, and "upstream" refers to upstream in the flow direction of the cooling air. In drawings, a reference letter "F" denotes the flow direction of the cooling air, a reference letter "P" denotes a direction orthogonal to the flow direction of the cooling air, a reference letter "U" denotes an upward direction (upward in the vertical direction), and a reference letter "D" denotes a downward direction (downward in the vertical direction).

Figure 1:
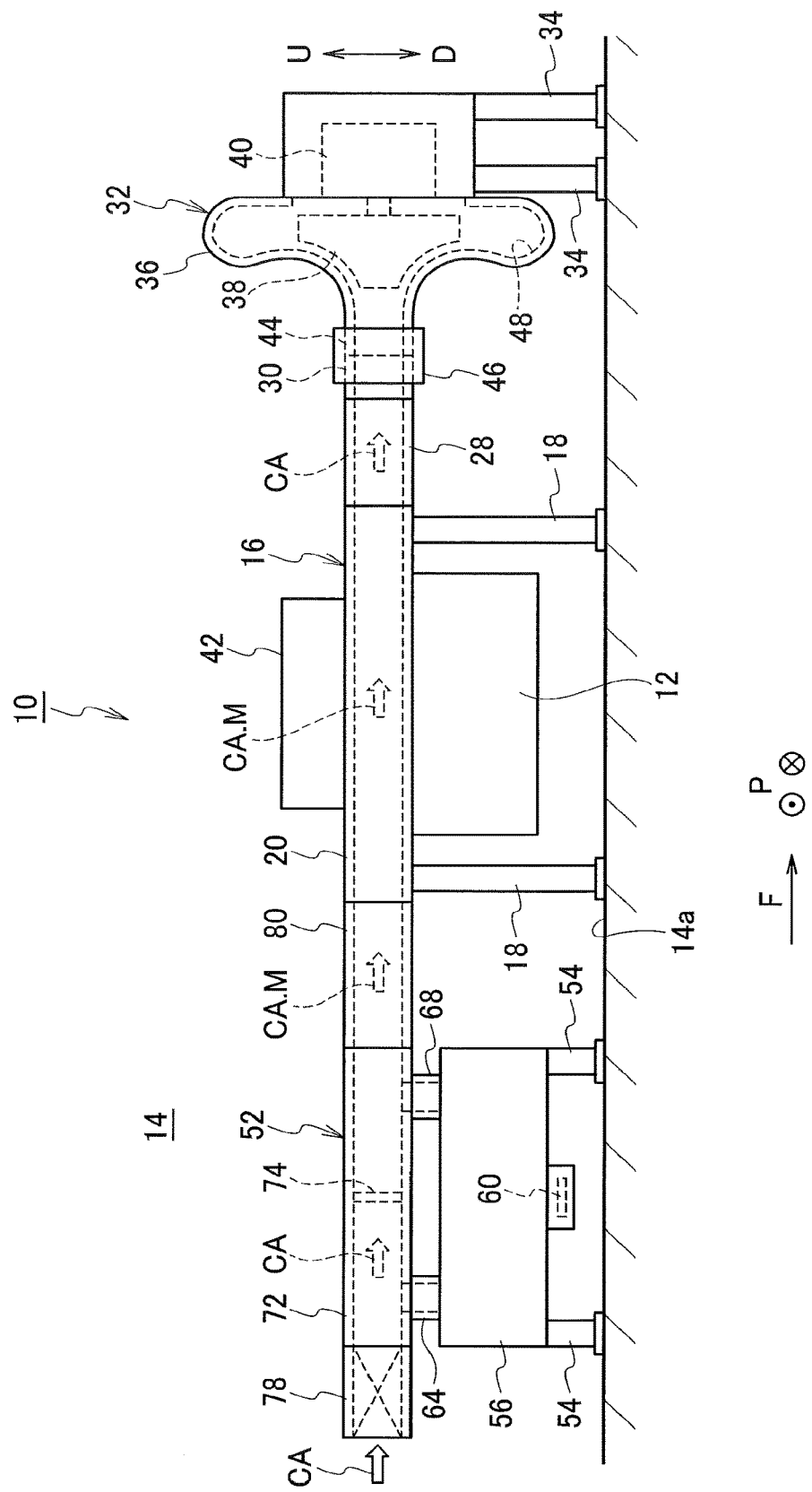
FIG. 1 is a schematic front view of a cooling device for electronic device according to an embodiment of the present disclosure.
Figure 2:
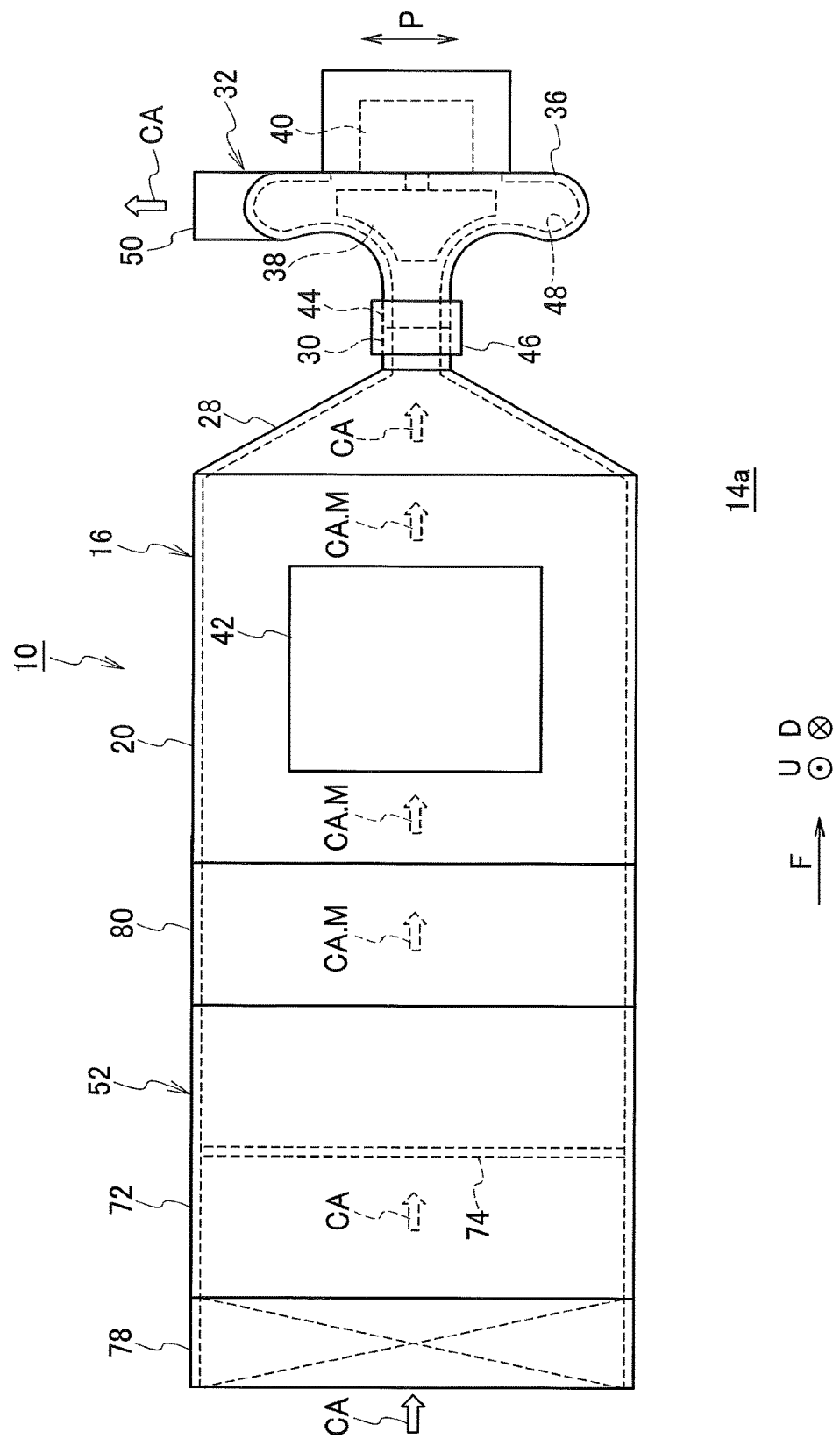
FIG. 2 is a schematic plan view of the cooling device for electronic device according to the embodiment of the present disclosure.

As shown in FIGS. 1 and 2, a cooling device for electronic device (hereinafter referred to as "cooling device" for convenience of explanation) 10 according to an embodiment of the present disclosure is a device that cools motor drivers 12 and 42. The cooling device 10 is installed, for example, on a floor 14a of an engine room 14 of an aircraft. The motor driver 12 that is to be cooled is an example of a power electronics-based device installed in the aircraft. The motor driver 12 is a driver that drives a not-shown taxiing motor that causes not-shown wheels of the aircraft to rotate.

The cooling device 10 includes a heat sink 16. The heat sink 16 is installed, for example, on the floor 14a of the engine room 14 by using a plurality of struts 18.

Figure 5:
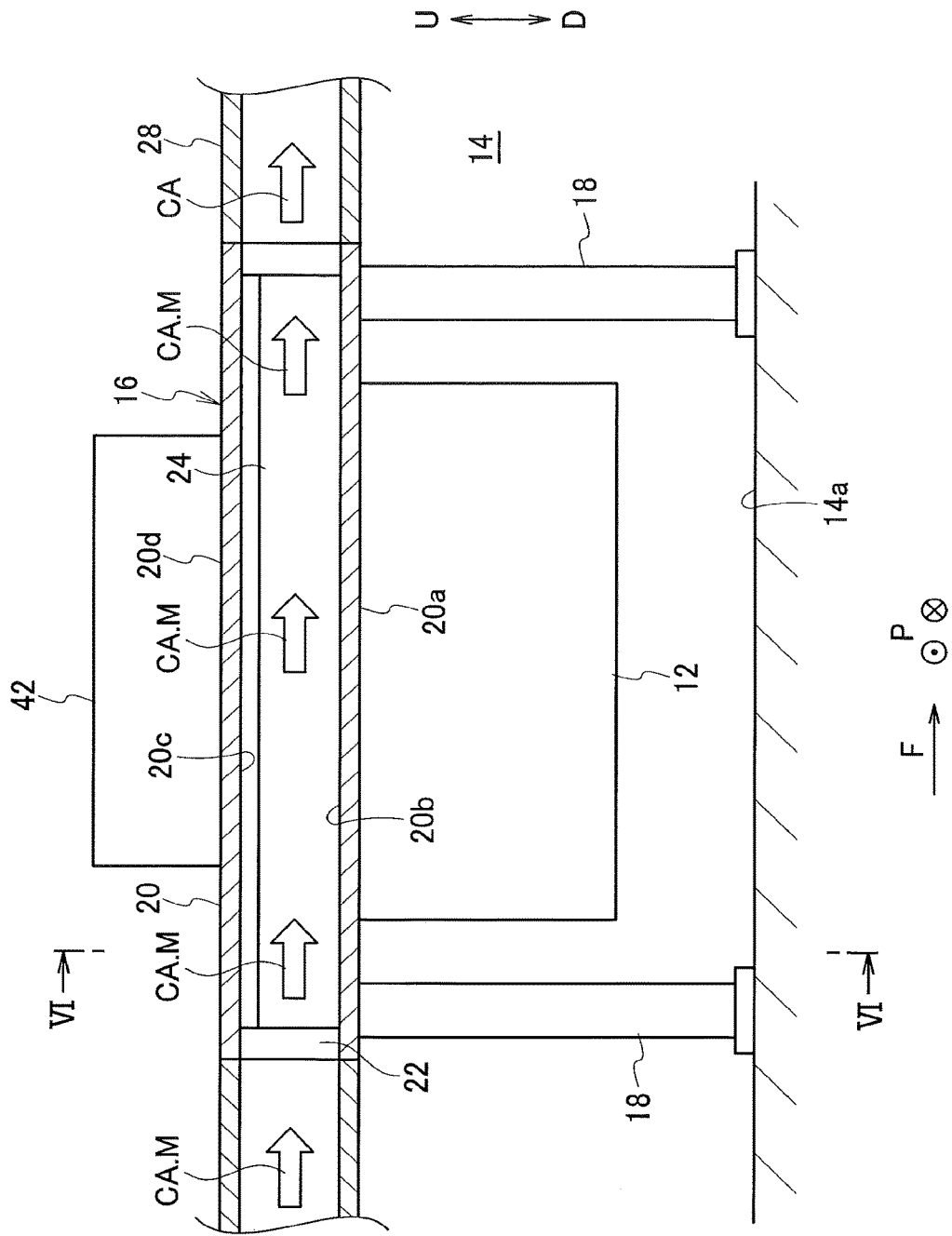
FIG. 5 is a schematic front sectional view of a peripheral structure that includes a heat sink according to the embodiment of the present disclosure.
Figure 6:
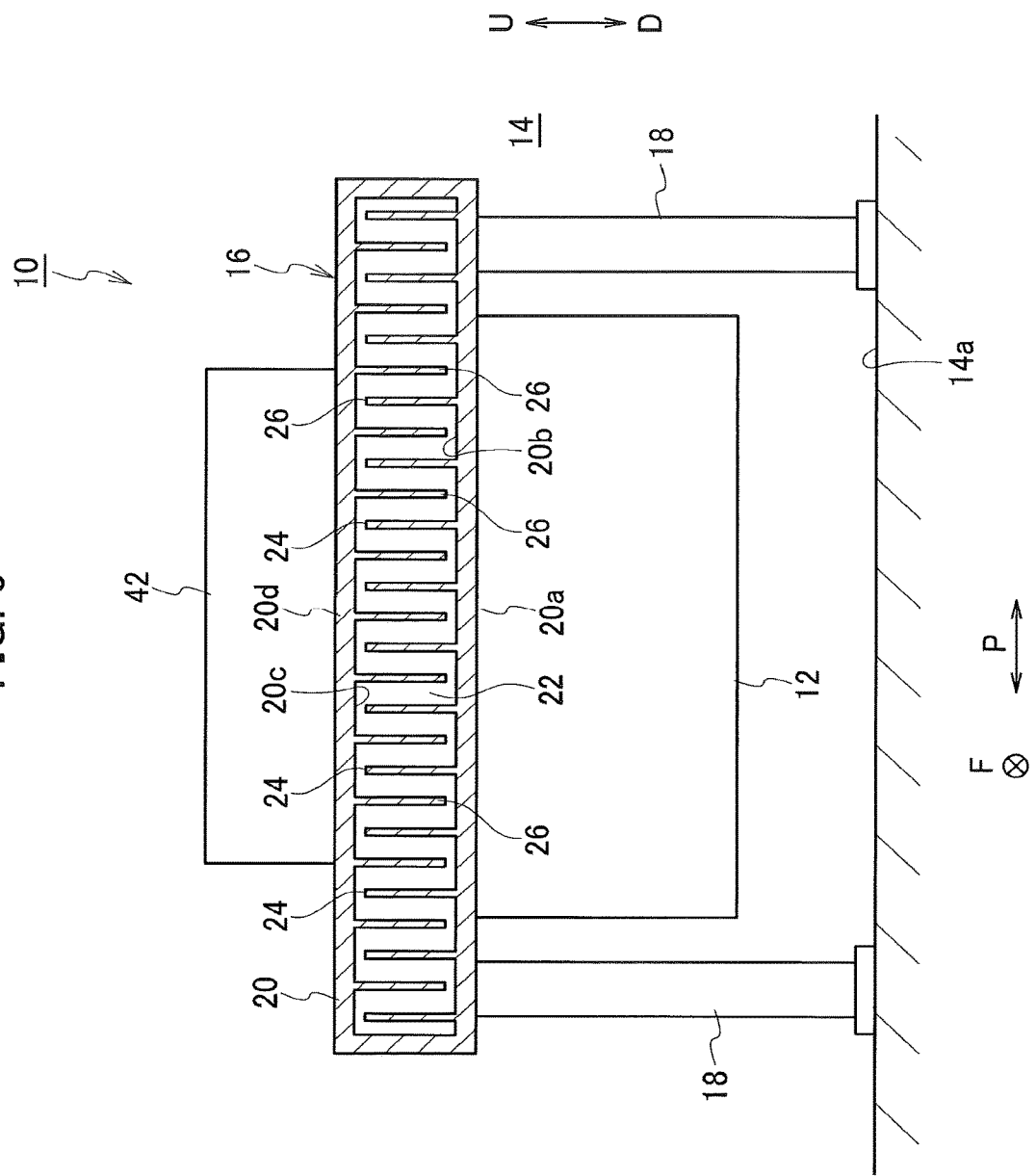
FIG. 6 is a cross-sectional view when seen from a direction indicated by a VI-VI line shown in FIG. 5.

As shown in FIGS. 5 and 6, the heat sink 16 is constituted by, for example, a material with an excellent thermal conductivity such as aluminum or aluminum alloy. The heat sink 16 includes a base (heat sink base) 20 formed in a square pipe-like shape. The base 20 includes a cooling passage 22 that is formed on the inner side of (inside) the base 20. Air from a passenger cabin flows into the cooling passage 22 as cooling air CA. The base 20 is connected in a heat-conductive manner to the motor driver 12. In other words, at the base 20, the heat sink 16 is in thermal contact with the motor driver 12. For example, the motor driver 12 is installed on a lower outer surface 20a of the base 20 of the heat sink 16.

The base 20 has a plurality of first heat radiating fins 24 arranged on a lower inner surface 20b thereof. The first heat radiating fins 24 are arranged at intervals in a direction P orthogonal to a flow direction F of the cooling air CA. The first heat radiating fin 24 is formed in a plate shape and extends in the flow direction F of the cooling air CA. Moreover, the heat sink base 20 includes a plurality of second heat radiating fins 26 installed on an upper inner surface 20c in the base 20. The second heat radiating fins 26 are arranged at intervals alternately with the first heat radiating fins 24 in the direction P. The second heat radiating fin 26 is formed in a plate shape and extends in the flow direction F of the cooling air CA.

Alternately, the first heat radiating fins 24 and the second heat radiating fins 26 can be formed in the form of a pin that extends in an upward direction U or a downward direction D. If formed so, the first heat radiating fins 24 and the second heat radiating fins 26 are arranged at intervals in the direction F and the direction P, respectively. Alternatively, the second heat radiating fins 26 can be omitted from the configuration of the heat sink 16. Alternatively, instead of the struts 18, the heat sink 16 can be installed on the floor of the engine room 14 by using other supporting units such as a pedestal.

The heat sink 16 includes on downstream thereof a collecting duct 28 that collects the cooling air CA. The collecting duct 28 communicates with the cooling passage 22 of the heat sink 16. Moreover, the collecting duct 28 includes on downstream thereof an air outlet 30 that sends the cooling air CA outside.

As shown in FIGS. 1 and 2, the cooling device 10 includes a compressor (electric compressor, fan) 32 arranged downstream of the heat sink 16 for sucking and compressing the cooling air CA. The compressor 32 is installed on the floor 14a of the engine room 14 by using a plurality of struts 34. The compressor 32 is an example of a blower that causes the cooling air CA to flow from an inlet toward an outlet of the cooling passage 22 of the heat sink 16.

The compressor 32

The compressor 32 includes a compressor housing 36, an impeller 38 that is rotatably arranged in the compressor housing 36, and a compressor motor 40 arranged in the compressor housing 36 and that rotates the impeller 38. The compressor motor 40 is driven by the motor driver 42. The motor driver 42 is connected in a heat-conductive manner to the heat sink 16. In other words, at the base 20, the heat sink 16 is in thermal contact with the motor driver 42. For example, the motor driver 42 is installed on an upper outer surface 20d of the base 20 of the heat sink 16.

The compressor housing 36 includes an air inlet 44 that is arranged upstream of the impeller 38 and that takes in the cooling air CA. The air inlet 44 communicates with the air outlet 30 via a coupling 46. The compressor housing 36 includes a spiral scroll flow path 48 that is arranged downstream of the impeller 38 in the compressor housing 36 and that collects the compressed cooling air CA. Furthermore, the compressor housing 36 includes arranged on the peripheral side thereof an air discharging port 50 for discharging the compressed cooling air CA. The air discharging port 50 communicates with the outside of the aircraft via a not-shown discharge pipe.

Instead of installing the electric compressor 32 by using the struts 34, the electric compressor 32, however, can be installed on the floor 14a of the engine room 14 by using other supporting units such as a pedestal.

The cooling device 10 includes, in the flow direction F of the cooling air CA that passes via the heat sink 16, a mist supplier 52 arranged upstream of the heat sink 16. The mist supplier 52 supplies mist M to the cooling passage 22 of the heat sink 16 by using ultrasonic waves and the like. The mist supplier 52 is installed on the floor 14a of the engine room 14 by using a plurality of struts 54. The main constituent (ingredient) of the mist M is, for example, water.

Figure 3:
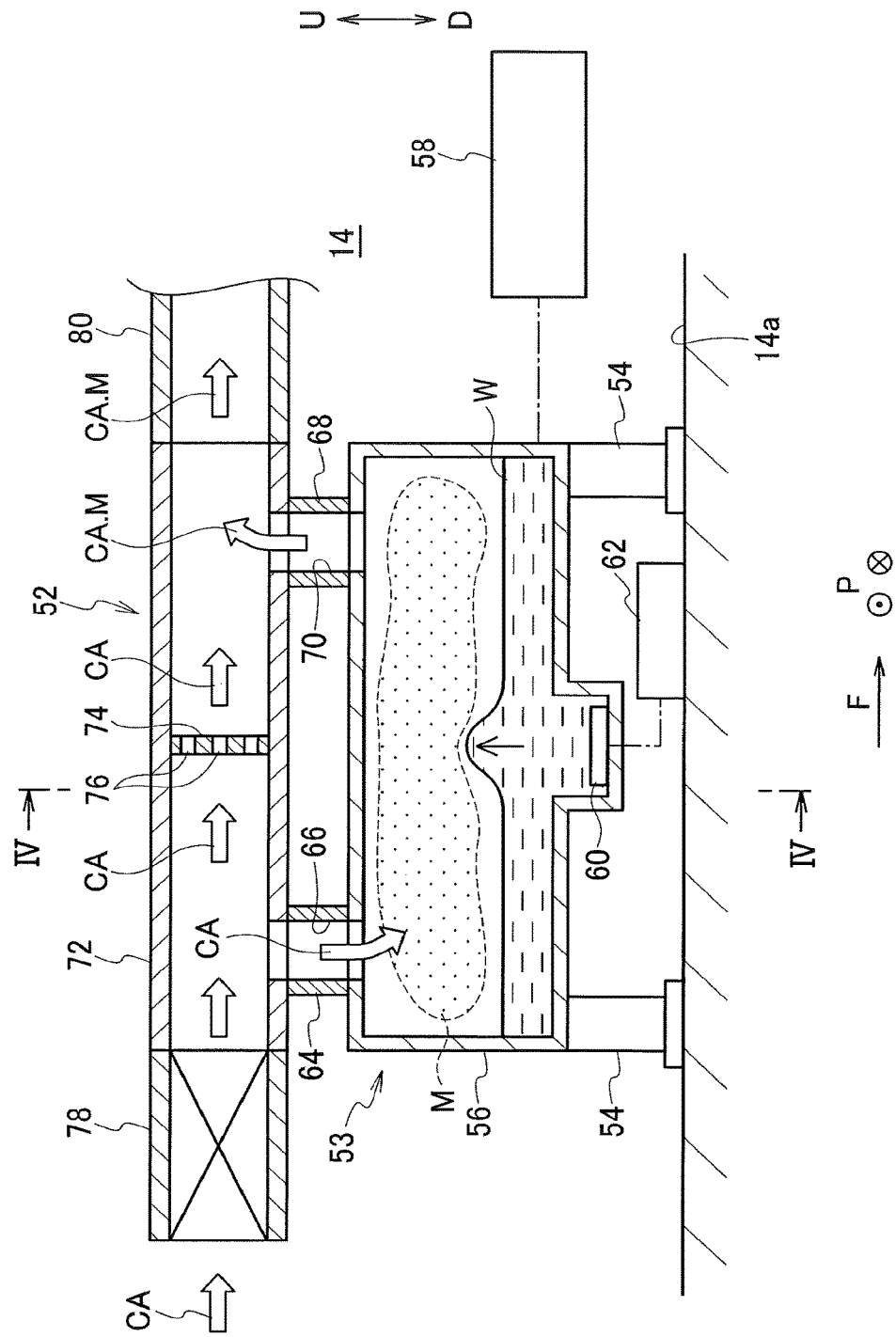
FIG. 3 is a schematic front sectional view of a peripheral structure that includes a mist supplier according to the embodiment of the present disclosure.
Figure 4:
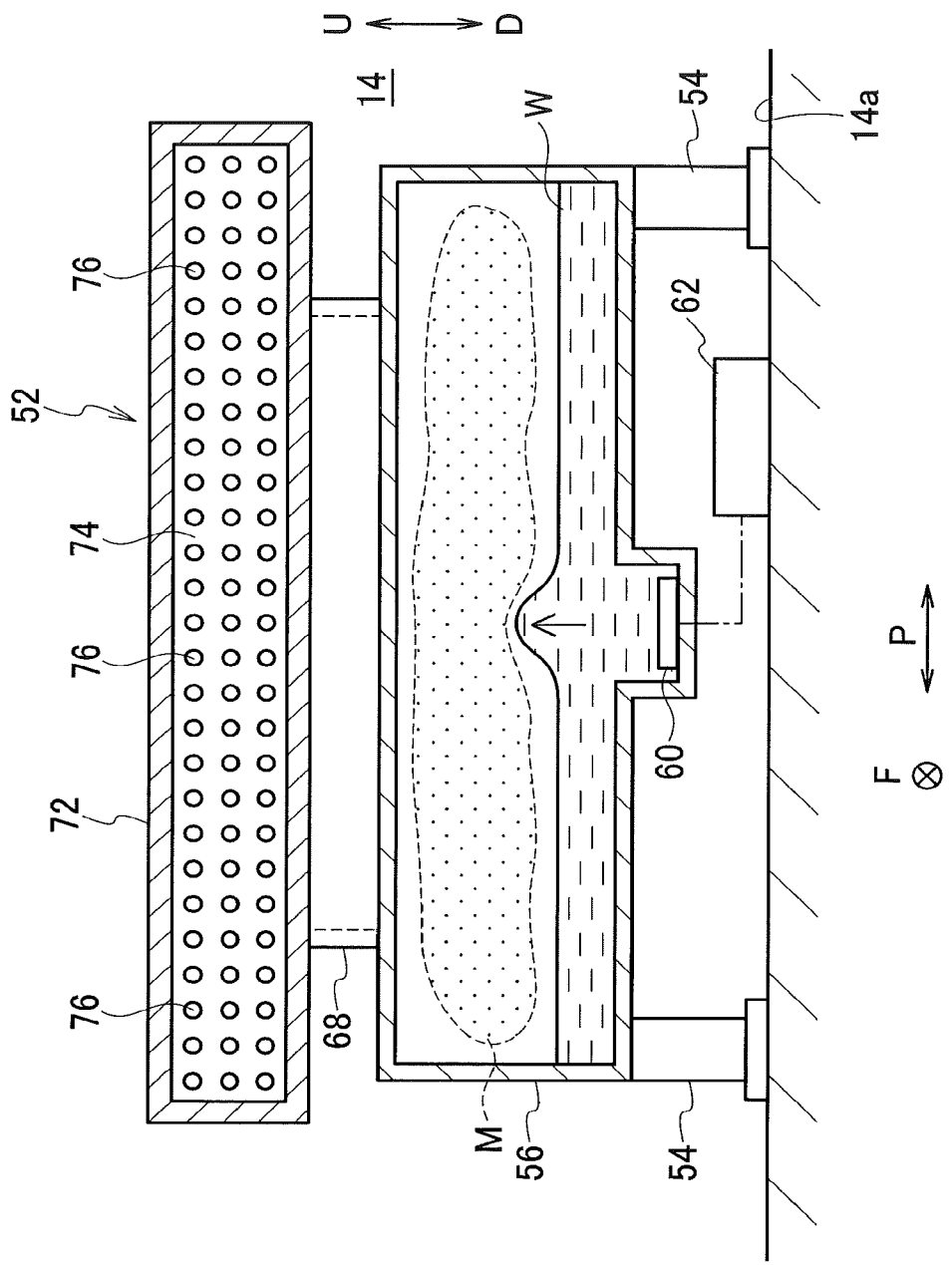
FIG. 4 is a cross-sectional view when seen from a direction indicated by a IV-IV line shown in FIG. 3.

As shown in FIGS. 3 and 4, the mist supplier 52 includes a storage tank (for example, a water tank) 56 that stores the ingredient (for example, water W) of the mist M. The storage tank 56 is installed on the floor 14a of the engine room 14 by using the struts 54. The storage tank 56 is connected to a tank 58 installed at an appropriate position in the engine room 14 for maintaining the level of the water W in the storage tank 56 at a predetermined water level or higher. At the bottom of the storage tank 56 is arranged a piezoelectric vibrator (an example of a vibrator) 60. The piezoelectric vibrator 60 is electrically connected to a driver circuit 62 installed at an appropriate position in the engine room 14. Upon receiving a high-frequency voltage from the driver circuit 62, the piezoelectric vibrator 60 vibrates, transmits (generates) the ultrasonic waves toward the surface of the water W stored in the storage tank 56, and atomizes the water W.

The storage tank 56 includes a first connecting member 64 arranged upstream (on a side away from the heat sink 16) at the top of the storage tank 56. The first connecting member 64 is formed in, for example, a square pipe-like shape and includes internally (inside) an introduction passage 66. The introduction passage 66 introduces the cooling air CA to a space inside the storage tank 56. Moreover, the storage tank 56 includes a second connecting member 68 arranged downstream (on a side near the heat sink 16) at the top of the storage tank 56. The second connecting member 68 is formed in, for example, a square pipe-like shape, and includes internally a lead-out passage 70. The lead-out passage 70 sends out from the space inside the storage tank 56 the cooling air CA which includes the mist M.

The mist supplier 52 includes an introduction duct 72 arranged between an upper part of the first connecting member 64 and an upper part of the second connecting member 68. The introduction duct 72 introduces to the cooling passage 22 of the heat sink 16 the cooling air CA that includes the water mist M. The introduction duct 72 internally communicates with the introduction passage 66 of the first connecting member 64 on an inlet side thereof. The introduction duct 72 internally communicates with the lead-out passage 70 of the second connecting member 68 on an outlet side thereof. Moreover, the introduction duct 72 includes arranged in the middle thereof (that is, between a portion connected to the introduction passage 66 and a portion connected to the lead-out passage 70) an adjusting plate (baffle plate) 74. The adjusting plate 74 has a plurality of through-holes 76 via which the cooling air CA passes, and is constituted by, for example, a perforated metal.

The adjusting plate 74 arranged in the introduction duct 72 adjusts a flow rate of the cooling air CA to be introduced to the introduction passage 66 of the first connecting member 64. In other words, the adjusting plate 74 leads to the introduction passage 66 a part of the cooling air CA flown in from an inlet of the introduction duct 72, and leads out the remaining cooling air CA directly toward an outlet of the introduction duct 72 without passing via the storage tank 56. That is, the mist supplier 52 includes a generating source for the mist M (hereinafter referred to as a mist generating source) 53 (see FIG. 3) and two flow paths that share an inlet of the cooling air CA and an outlet of the cooling air CA that flows towards the heat sink 16 (the cooling passage 22). The mist generating source 53 includes the storage tank 56 and the piezoelectric vibrator 60. One of the two flow paths (a first flow path: the introduction passage 66, the storage tank 56, and the lead-out passage 70) passes via the mist generating source 53, and the other flow path (a second flow path: the introduction duct 72) does not pass via the mist generating source 53. Furthermore, in the second flow path, the adjusting plate 74 explained above is arranged between a branching point and a confluence point thereof from and to the first flow path, and the adjusting plate 74 adjusts the flow rate of the cooling air CA that flows via each flow path.

To adjust the flow rate of the cooling air CA to be introduced to the introduction passage 66, the introduction duct 72 can internally include on the inlet side thereof a not-shown throttle. Moreover, instead of installing the mist supplier 52 by using the struts 54, the mist supplier 52 (the storage tank 56) can be installed on the floor 14a of the engine room 14 by using other supporting units such as a pedestal.

The introduction duct 72 includes upstream thereof a filter 78 that cleans the cooling air CA. A mixing duct 80 arranged between the introduction duct 72 and the heat sink 16 facilitates mixing of the cooling air CA and the mist M. An inlet arranged inside the mixing duct 80 communicates with the outlet arranged inside the introduction duct 72. An outlet arranged inside the mixing duct 80 communicates with the inlet of the cooling passage 22 of the heat sink 16 (inside of the heat sink 16).

Alternatively, other intermediate members such as a connecting pipe can be interposed between the introduction duct 72 and the filter 78.

Next, effects and advantages of the embodiments according to the present disclosure are explained.

During the operation of the motor driver 12, when the impeller 38 rotates by the driving of the compressor motor 40, the compressor 32 sucks and compresses the cooling air CA. Then, suction action of the compressor 32 causes the cooling air CA to flow from the inlet toward the outlet of the cooling passage 22 of the heat sink 16 via the filter 78, the introduction duct 72, and the like. The heat generated by the operation of the motor driver 12 of the taxiing motor is transmitted to the heat sink 16 and then radiated to the cooling air CA via the first heat radiating fins 24, the heat sink base 20, and the like. At the same time, the heat generated by the operation of the motor driver 42 of the compressor motor 40 is transmitted to the heat sink 16 and then radiated to the cooling air CA via the second heat radiating fins 26, the heat sink base 20, and the like. After receiving the heat generated by the motor drivers 12 and 42, the compressor 32 sucks and compresses the cooling air CA, and then discharges the same to the outside of the aircraft via the air discharging port 50.

When the cooling air CA is flowing from the inlet to the outlet of the cooling passage 22 of the heat sink 16 via the filter 78, the introduction duct 72, and the like, the driver circuit 62 supplies a high-frequency voltage to the piezoelectric vibrator 60. Upon receiving the voltage, the piezoelectric vibrator 60 vibrates and transmits the ultrasonic waves toward the surface of the water W in the storage tank 56. When the ultrasonic waves are transmitted in the water W, the mist M is generated from the surface of the water W in the storage tank 56. Inside the storage tank 56, the generated mist M mixes with the cooling air CA introduced from the introduction passage 66 of the first connecting member 64. The cooling air CA in which the mist M is included is then sent to the outlet of the introduction duct 72 via the lead-out passage 70 of the second connecting member 68 and supplied to the inlet of the cooling passage 22 of the heat sink 16 via the mixing duct 80. Accordingly, when compared with, for example, a configuration that uses dry air to perform cooling, rise in the temperature of the cooling air CA in the cooling passage 22 of the heat sink 16 can be further suppressed by the cooling effect of the latent heat of vaporization (heat of vaporization) of the mist M. Consequently, the temperature difference between the heat sink 16 and the cooling air CA can be increased without increasing the heat transfer coefficient between the heat sink 16 and the cooling air CA. In other words, the temperature difference between the heat sink 16 and the cooling air CA can be increased without employing measures such as forming the first heat radiating fin 24 and the like in a complex shape or increasing the number of the first heat radiating fins 24 and the like.

The adjusting plate 74 arranged in the introduction duct 72 adjusts the flow rate of the cooling air CA to be introduced to the introduction passage 66. When the cooling air CA is supplied excessively to the storage tank 56, disturbance in the storage tank 56 accelerates leading to an increase in the particle size of the mist M. Increase in the particle size of the mist M causes increase in a resistance of the flow of the cooling air CA in the cooling passage 22 (for example, space between the first heat radiating fins 24 and the second heat radiating fins 26). Increase in the resistance, for example, may affect the change in the cooling capability corresponding to the flow rate (flow speed) of the cooling air CA, and controlling the flow rate of the cooling air CA may become difficult. The adjusting plate 74 controls the excessive supply of the cooling air CA to the storage tank 56, and suppresses undesired increase in the particle size of the mist M, in other words, increase of the large-particle sized components in a particle size distribution of the mist M.

With the configuration explained above, the motor driver 12 of the taxiing motor can be sufficiently cooled, and rise in the temperature of the motor driver 12 of the taxiing motor can be suppressed. Also, the motor driver 42 of the compressor motor 40 can be sufficiently cooled, and rise in the temperature of the motor driver 42 of the compressor motor 40 can be suppressed.

Therefore, according to the embodiments of the present disclosure explained above, the temperature difference between the heat sink 16 and the cooling air CA can be increased without employing measures such as forming the first heat radiating fin 24 and the like in a complex shape or increasing the number of the first heat radiating fins 24 and the like. Therefore, according to the embodiments of the present disclosure, the radiation performance of the heat sink 16, in other words, the cooling performance of the cooling device 10 can be sufficiently improved while reducing the pressure loss in the cooling passage 22 of the heat sink 16 and controlling the increase in the size of the compressor 32 and the energy consumption required for blowing air.

In particular, according to the embodiments of the present disclosure, even if the flow rate of the cooling air CA is reduced, the cooling performance of the cooling device 10 can be sufficiently improved and the cooling air CA can be effectively utilized in the aircraft.

The present disclosure, however, is not limited to the embodiments explained above, and can be implemented, for example, in the following various modes. The cooling device 10 can be used for cooling a power electronics-based device other than the motor driver 12, or an electronic device other than the power electronics-based device. Instead of using the compressor 32, a not-shown other blower such as a fan can be used to cause the cooling air CA to flow from the inlet of the cooling passage 22 of the heat sink 16 toward the outlet of the same.

The scope of rights included in the present disclosure is not limited to the embodiments explained above.

A test device that is simulated as a cooling device was manufactured, and a cooling performance test was conducted on the test device. During the cooling performance test, the amount of water-generated mist included in the cooling air was changed. From a heat sink included in the test device, a plurality of first heat radiating fins and a plurality of second heat radiating fins were omitted, and instead of including an electronic device, the heat sink included in the test device included a heater (heating element) on the lower surface thereof.

Figure 7A:
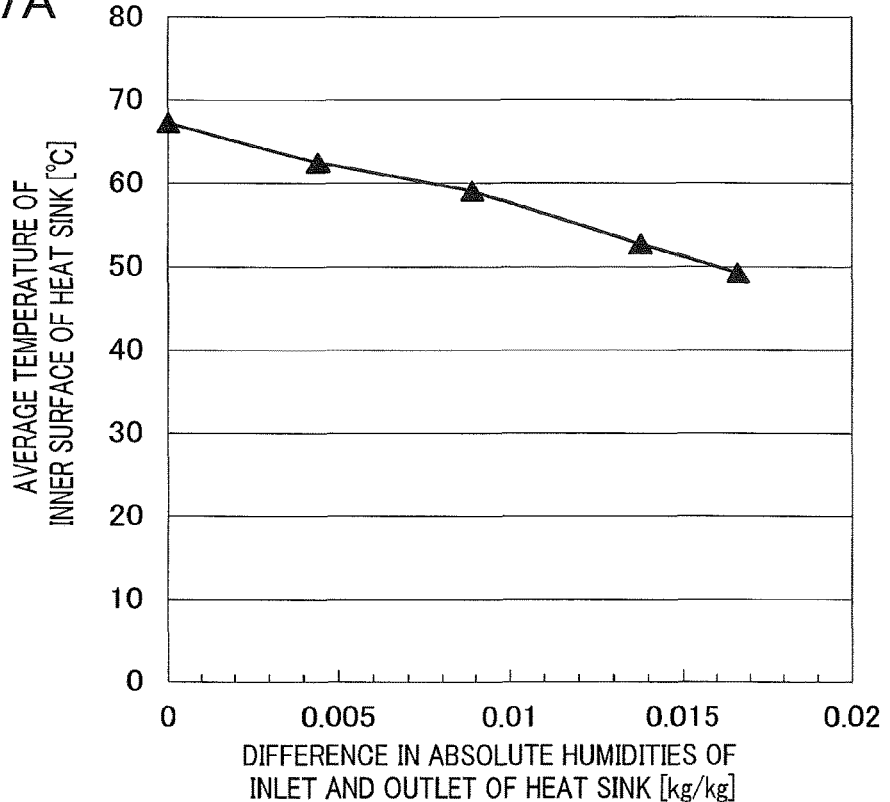
FIG. 7A is a diagram showing a relation between a difference in absolute humidities at an inlet and an outlet of the heat sink and an average temperature of an inner surface of the heat sink.

FIG. 7A shows as a result of the cooling performance test a relationship between a difference in absolute humidities at an inlet (inlet end) and an outlet (outlet end) of the heat sink and an average temperature of an inner surface of the heat sink. As shown in FIG. 7A, it was found that, as the difference in the absolute humidities at the inlet and the outlet of the heat sink increases, the average temperature of the inner surface of the heat sink decreases, leading to an improvement in the cooling performance. The difference in the absolute humidities at the inlet and the outlet of the heat sink refers to a difference in the absolute humidities obtained by subtracting the absolute humidity at the outlet of the heat sink from the absolute humidity at the inlet of the heat sink. If the cooling air does not include the water mist, the absolute humidity difference between the inlet and the outlet of the heat sink becomes zero.

Figure 7B:
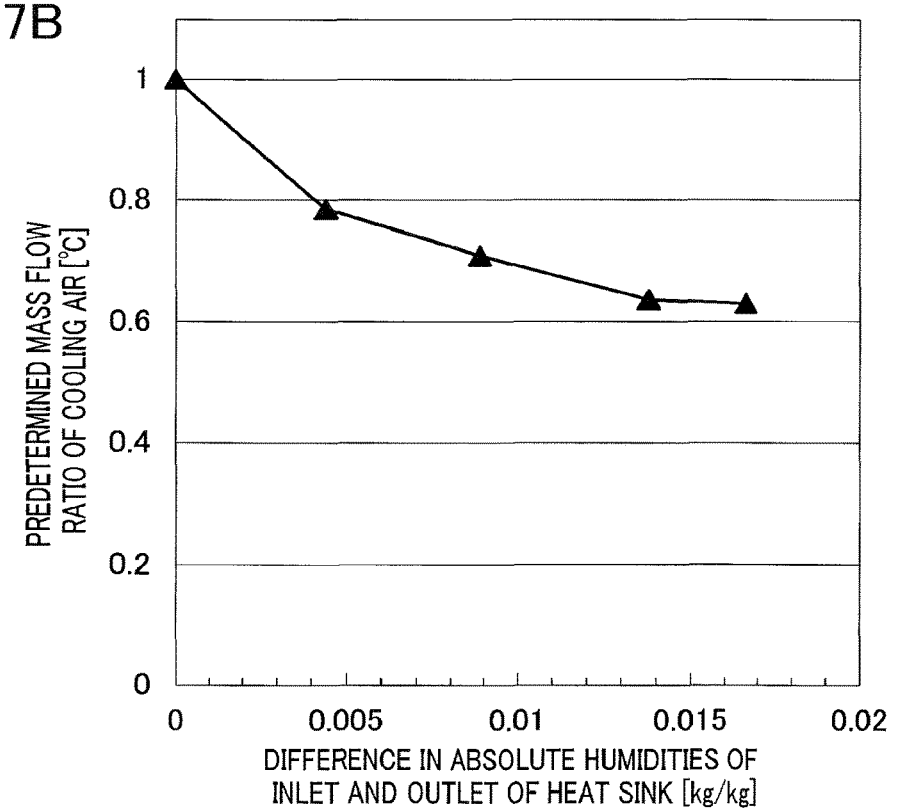
FIG. 7B is a diagram showing a relation between the difference in the absolute humidities at the inlet and the outlet of the heat sink and a predetermined mass flow ratio of cooling air.

FIG. 7B shows as a result of the cooling performance test a relationship between the difference in the absolute humidities at the inlet and the outlet of the heat sink and a predetermined mass flow ratio of the cooling air. In this scenario, the predetermined mass flow ratio refers to, based on a condition in which the cooling air does not include the water-generated mist, a ratio of the flow rate of the cooling air required to maintain the average temperature of the inner surface of the heat sink at a predetermined temperature. As shown in FIG. 7B, it was found that, as the absolute humidity difference between the inlet and the outlet of the heat sink increases, the predetermined mass flow ratio decreases, and sufficient cooling performance is demonstrated even if the flow rate of the cooling air is reduced.

What is claimed is:

1. A cooling device for an electronic device, comprising:
   a heat sink configured to be in thermal contact with the electronic device; and
   a mist supplier configured to supply mist to the heat sink, arranged upstream of the heat sink in a flow direction of cooling air passing via the heat sink, wherein
   the mist supplier includes
      a mist generating source configured to generate the mist included in the cooling air; and
      a first flow path and a second flow path that share an inlet of the cooling air and an outlet of the cooling air that flows toward the heat sink,
   the first flow path passes via the mist generating source,
   the second flow path does not pass via the mist generating source, and
   an adjusting plate for cooling air is arranged in the second flow path between a branching point and a confluence point with the first flow path.

2. The cooling device according to claim 1 further comprising a blower configured to cause the cooling air to flow from an inlet toward an outlet of the heat sink.

3. The cooling device according to claim 2, wherein
   the blower is a fan arranged downstream of the heat sink, and
   the fan is configured to suck the cooling air.

4. The cooling device according to claim 3, wherein
   the fan includes:
      an impeller;
      a motor configured to rotate the impeller; and
      a driver configured to drive the motor, and
   the driver is in thermal contact with the heat sink.

* * * * *